United States Patent [19]

Czarniak et al.

[11] Patent Number: 4,656,435
[45] Date of Patent: Apr. 7, 1987

[54] CONSTANT BIASING CIRCUIT AND OPERATIONAL AMPLIFIER USING SAID CIRCUIT

[75] Inventors: Jean-Christophe Czarniak, Saint Paul de Vence; Rene Diot, Castries, both of France

[73] Assignee: International Business Machines Corporation, Armonk, N.Y.

[21] Appl. No.: 812,416

[22] Filed: Dec. 23, 1985

[30] Foreign Application Priority Data

Dec. 28, 1984 [EP] European Pat. Off. ........ 84430047.5

[51] Int. Cl.⁴ ............................ H03F 3/30; H03F 3/45
[52] U.S. Cl. ...................................... 330/253; 330/255; 330/264; 330/267
[58] Field of Search ............... 330/253, 255, 267, 264, 330/268, 273, 274

[56] References Cited

U.S. PATENT DOCUMENTS 3,611,170 10/1971 Wheatley, Jr. ................. 330/267 X

FOREIGN PATENT DOCUMENTS 154246 12/1979 Japan .................................... 330/264

OTHER PUBLICATIONS

IEEE Journal of Solid-State Circuits, vol. SC-18, No. 1, Feb. 1983, pp. 121-127.

*Primary Examiner*—James B. Mullins
*Attorney, Agent, or Firm*—Stephen J. Limanek

[57] ABSTRACT

A constant biasing circuit is made to maintain a fixed difference of potential between two circuit nodes A and B otherwise at floating potential levels. The biasing circuit is made of series connected complementary transistors disposed between the circuit nodes A and B and having their gate electrodes respectively connected to opposite voltages of, e.g., +5 volts and −5 volts.

12 Claims, 3 Drawing Figures

CONSTANT BIASING CIRCUIT AND OPERATIONAL AMPLIFIER USING SAID CIRCUIT

DESCRIPTION

1. Technical Field

This invention relates to constant biasing circuits, and more particularly to operational amplifiers using field effect transistors (FET).

2. Background Art

Many circuits exist which require a predetermined fixed difference of potential between two circuit points otherwise brought to floating voltages during normal operating conditions. To make the case clearer, the invention will be exemplified as applied to operational amplifier circuits.

Operational amplifiers are among the most commonly used analog types of circuits. Therefore, any improvements to this kind of circuit are of high interest, particularly where these improvements match with integration techniques.

Most FET operational amplifiers include a differential input stage loaded for driving an output stage through one or several driver stage(s).

The amplifier output stage is conventionally made to include a couple of field effect transistors operating in push-pull mode. The linearity of the response of the output stage may be achieved by properly adjusting the relative biasing of the output transistors. In other words, distortions of the output signal are avoided by providing a relatively constant difference of potential between the gates of the two output FET transistors, which otherwise would be at independently floating voltage levels.

One way of implementing the circuit may be seen in the operational amplifier disclosed in the IEEE Journal Of Solid-State Circuits, Vol. SC-18, No.1, February 1983 pp 121-127. A transistor acting as a resistor has been inserted between the gates of the output transistors whereby the difference of potential is being generated during the amplifier operation. This transistor acts as a biasing element which allows each of the output gate nodes to be driven over virtually the full range between the supply voltages. Such a solution may however present several drawbacks. For instance, the circuit characteristics may vary with the floating voltages to be controlled. In addition the transistor would have to be prohibitively long and precision would be hard to get in the considered technology.

DISCLOSURE OF THE INVENTION

Improvement is being provided in this invention by biasing the output stage of an operational amplifier through a circuit including series mounted complementary transistors connected between the output transistors gates and biased to maintain a constant difference of potential between the gates, throughout the overall operating range.

More generally speaking, an object of this invention is to provide a controllable fixed difference of potential between two circuit nodes, which nodes would otherwise be at floating potential levels, by inserting series mounted complementary transistors oppositely biased.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1A:
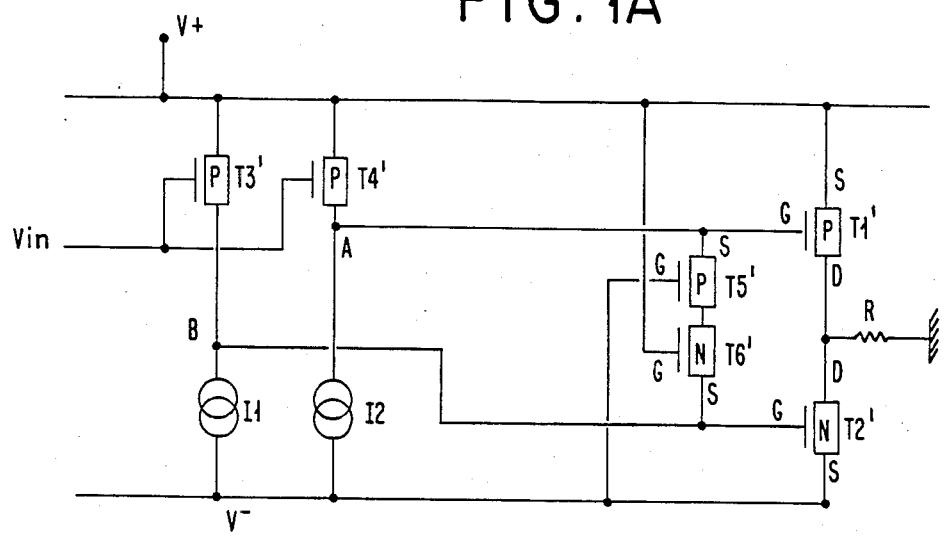
FIG. 1A represents one embodiment of the circuit of this invention.

Shown in FIG. 1A is a push-pull amplifier including the biasing circuit of this invention. The push-pull output circuit is made of field-effect transistors T1' and T2', respectively, of p and n channel types, and having their source electrodes respectively connected to V+ and V− supplies, and their drain electrodes connected to ground through a resistive load impedance R.

The gate electrodes of T1' and T2' are driven by a driver stage including p channel type FETs T3' and T4' each connected to a current sink I1 or I2, respectively.

Figure 1B:
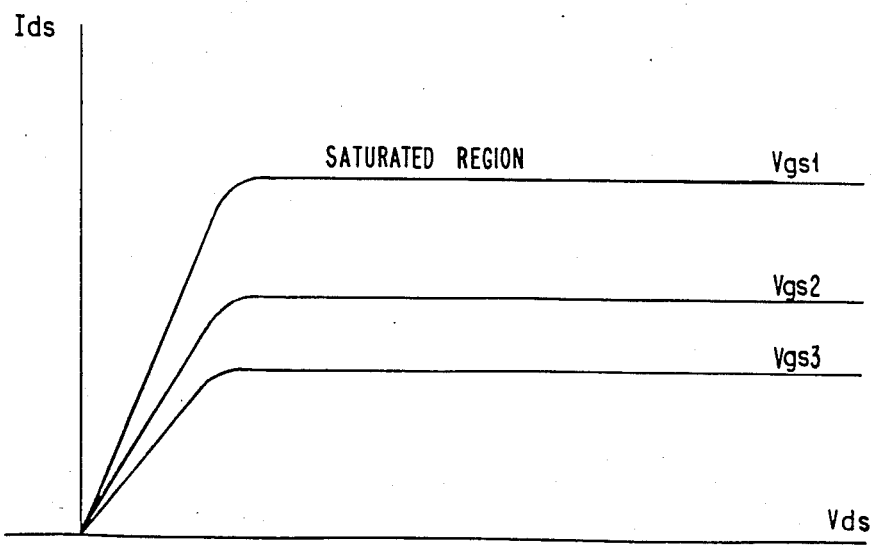
FIG. 1B is a graph indicating drain-to-source current versus voltage characteristics of field effect transistors.

The input signal Vin is applied to the gates of both transistors T3' and T4'. When the input voltage increases, then the voltage potentials at nodes A and B decrease. The node A and node B potentials are floating and vary according to the drain-to-source current (Ids) versus drain-to-source voltage (Vds) characteristics of transistors T3' and T4', which characteristics are not linear. In other words, the voltages at nodes A and B could quit the saturation region of the Ids (Vds) characteristics (see figure 1B). This could lead to both of the push-pull transistors being forced on or off together, which obviously does not match with push-pull operating conditions.

To avoid these drawbacks the potentials of nodes A and B should be forced to remain different from each other. This objective could be achieved by inserting a resistance between nodes A and B, but this method also presents drawbacks.

As an alternative one may insert one transistor between nodes A and B, but under normal operating conditions this solution may also be avoided for reasons already mentioned and to be developed later hereinbelow in connection with FIG. 2 of the drawings.

Finally, the solution of this invention recommends that a symmetrical arrangement of complementary FET devices having their input electrodes connected to opposite voltages, be inserted between nodes A and B.

The simplest of these arrangements, as illustrated in FIG. 1A, includes a couple of series connected FETs T5' and T6' having their source electrodes respectively connected to the gate electrodes of FETs T1' and T2' and their gate electrodes connected to V− and V+, i.e., opposite fixed voltages, respectively. FETs T5' and T6' are respectively p-channel and n-channel types of FETs. The structural arrangement of T5' and T6' is chosen to have both transistors operate in the linear portion of their Ids (Vds) characteristics. Assuming the potentials at nodes A and B increase, then the gate-to-source Vgs of transistor T5' increases, but the Vgs of transistor T6' decreases. The drain-to-source resistance of T5' decreases, while the drain-to-source resistance of T6' increases, resulting in an auto-compensation of the overall resistance value. The gates biasing of transistors T1' and T2' remain constant, and the impedance seen between nodes A and B is always the same. The output gain is constant and substantially equivalent for both transistors T1' and T2'. This takes care of the distortion and offset control requirements. Also, the current in transistor T6' and T5' flows from V+ to V− through T4' and I1 sink. Given the circuit biasing the gates of transistors T1' and T2', their Vgs is low. Thus, the sizes of the output devices and the power dissipation are kept small relative to the load drive capability. The quiescent current in transistors T1' and T2' is low and fairly stable, by selecting the bias current forced through transistors T5'-T6'. If the voltage on node B rises, then the voltage on node A also rises, Vgs1 (gate-to-source voltage of transistor T1) decreases while Vgs2 (gate-to-source voltage of transistor T2) increases. Thus, the transistor T1' turns off and current flows through the load and T2', from ground to the lowest voltage (−5 volts). If the voltage on node B decreases, transistor T2' turns off, and current flows form the highest voltage (+5 V) to ground, through transistor T1' and the load.

Figure 2:
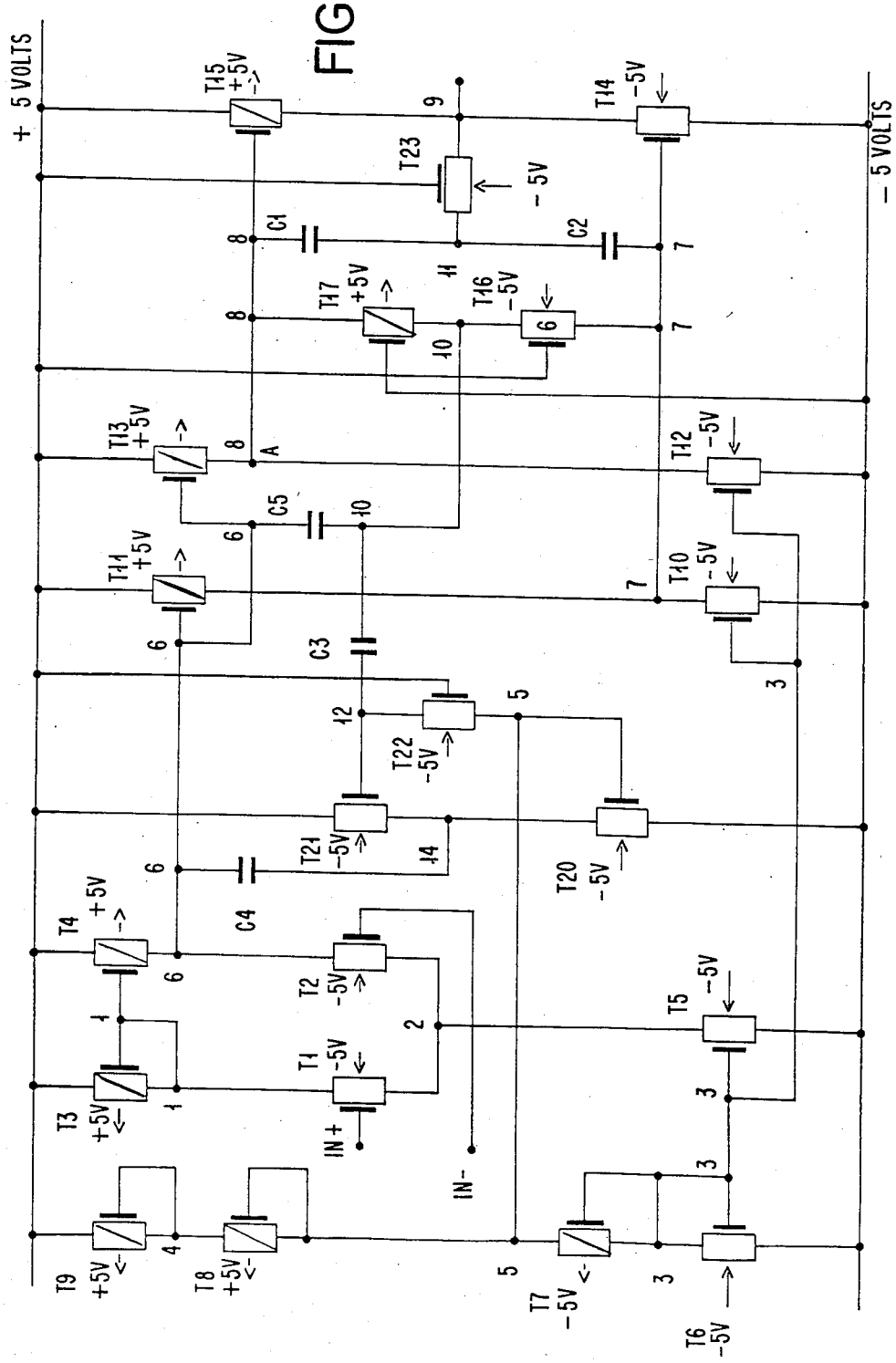
FIG. 2 illustrates an operational amplifier incorporating the circuit of this invention.

A preferred embodiment of circuit incorporating the invention is illustrated in FIG. 2 of the drawing. Shown therein is a complementary-metal-oxide-semiconductor (CMOS) operational amplifier.

A bias current network is made of three p-channel transistors (T7-T8-T9) and two n-channel transistors (T5-T6). Transistors T6, T7, T8 and T9 are diode connected by having their drain to gate path short circuited; as a consequence these transistors operate in the saturated region. Transistor sizes are chosen to provide a predetermined current (e.g., 18 micro-amperes) in the network. Transistors T7-T8-T9 may be replaced by a single but longer transistor. With a single transistor, the Vgs (gate-to-source voltage) would be such as to require a much longer channel or a much narrower channel to maintain the required current.

Using four transistors prevents an excessively high drain-to-source voltage, as would be the case with only one device. This arrangement also allows different voltages at nodes 3, 4 and 5. These tension nodes are used to polarize other stages of the circuit.

Transistors T5, T6 act as a current mirror. These two transistors are similar, and, therefore, they provide the same current.

The differential input stage includes essentially transistors T1, T2, T3 and T4 arranged into an asymmetrical stage with a single output. Input transistors T1 and T2 are n-channel type. Load transistors T3 and T4 are p-channel type. Voltages at nodes 6 and 1, being substantially identical, are chosen to provide a large signal swing. The node voltage is fixed by the size of transistor T3, and the desired current.

The driver stage is made to include transistors T10, T11, T12, T13, T16 and T17. Transistors T10, T11 and T12, T13 act as two separate stages, driving p- and n-channel output devices. The gates of n-channel transistors T10 and T12 are connected to node 3. The voltage at the node, and the sizes of transistors T10 and T12 determine the current value in transistor T10, T11 and T12, T13 inverter circuits. This current is sufficiently high to quickly charge device capacitances, and reduce response time.

Transistors T11 and T13 gates are symmetrically driven by the differential-stage output voltage. If the voltage at node 6 increases, then the voltages at nodes 7 and 8 decrease. Given that transistors T10, T11, T12 and T13 are common source connected, the potentials at nodes 7 and 8 are not fixed, and could thus shift into the linear region of the drain-to-source current versus drain-to-source voltage (Ids (Vds)) characteristics. This may lead to a situation wherein the voltages at nodes 7 and 8 are such as to force both output transistors T14 and T15 into the same conducting or non-conducting conditions, which should be avoided. In other words, assuming for instance both transistors to be simultaneously conducting, then distortion and an offset voltage will appear in the output signal. To prevent such an operating condition to occur, as was mentioned with reference to FIG. 1A, a constant difference of potential generating circuit has been inserted between nodes 7 and 8. This circuit has been made to include series connected complementary types of FET transistors. The preferred embodiment of such a circuit has been made with two transistors, i.e., transistors T16, T17, in accordance with the principles disclosed with reference to FIG. 1A.

With such a circuit, whenever the voltage at node 6 varies, the voltages at both nodes 7 and 8 vary symmetrically. Furthermore, by providing a constant voltage drop between nodes 7 and 8, the gate-to-source voltage for the output transistors T14 and T15 is fixed.

Given the power supplies used, the voltage drop between nodes 7 and 8 is about 5.5 volts. Assuming a current of about 13 micro-amperes in the transistor T16, T17 path, then maintaining the desired voltage drop with only one transistor would not be physically possible for several reasons. For instance, with a drain-to-source voltage (Vds) of 5.5 volts, the single transistor would operate in the saturated region, which means that its drain to source resistance would be about 10 megohms or higher. With present technologies this resistance value would be prohibitive and adequate biasing of nodes 7 and 8 cannot be achieved. To prevent the transistor from working in the saturated region it should be biased under a fairly high gate-to-source voltage (Vgs). With present integrated circuit technologies, the transistor device would then be prohibitively long and narrow to maintain the low desired quiescent current, under such a high Vgs. Furthermore, the gate of this transistor would be connected to a fixed voltage, say of V=+5, for an n-channel device. With such a bias, the gate-to-source voltage (Vgs) would vary in accordance with the potential at node 7 (or 8 depending on the transistor type). This means that the drain-to-source resistance does not remain constant when potentials at nodes 7 and 8 vary. Therefore, the biasing of the gates of transistors T14 and T15 would change with the input signal, resulting into distortions and offset conditions.

The circuit of this invention avoids the above mentioned drawbacks by essentially using the series connected complementary FET transistors. For instance, the circuit is made to include the two transistor devices, T16 and T17. Transistor T16 is an n-channel type and transistor T17 is a p-channel type. The gates of these transistors are respectively connected to +5 V and −5 V. The drain-to-source voltage of each device is about $(V(8)-V(7))=5.5/2=2.75$ volts, assuming transistors T16 and T17 are designed to provide zero volt at node 10, i.e., at the connection between transistors T16 and T17. With such a design, transistors T16 and T17 operate in the linear region of the Ids (Vds) characteristics, providing, therefore, an equivalent resistance of about 425 Kohms.

A second feedback circuit including capacitors C3, C4 and C5 and transistors T20, T21 and T22 has been added to enhance the phase margin limit provided with one single circuit including capacitors C1, C2 and transistor T23. Using only that single circuit the operational amplifier might present risks of oscillations when connected in unity gain. Transistors T20, T21 are in a source-follower stage, with a unity gain, which prevents the signal from flowing directly from node 6 to node 10 at high frequencies. The capacitor C4 prevents any voltage shift at the output of the differential stage (node 6), because of the source-follower output voltage. Although with such a compensation circuit, the phase margin is improved it might fall at high frequencies. Again this is avoided by inserting capacitor C4 which prevents the voltage at the output of the differential stage (node 6) from shifting due to the source-follower output voltage.

While the invention has been particularly shown and described with reference to preferred embodiments thereof, it will be understood by those skilled in the art that various changes in form and details may be made therein without departing from the spirit and scope of the invention.

What is claimed is:

1. A constant biasing circuit for maintaining a constant difference of potential between first and second circuit nodes each at an independently floating voltage level, said constant biasing circuit comprising an output circuit having first and second devices, said first device having a control electrode connected to said first node and said second device having a control electrode connected to said second node, and a symmetrical circuit having at least two series connected complementary transistor devices disposed between said nodes, and having gates connected to opposite polarity voltages.

2. A constant biasing circuit, as set forth in claim 1 wherein said complementary transistor devices are complementary field effect transistors.

3. A constant biasing circuit as set forth in claim 2 wherein said complementary field effect transistors include a p channel transistor and an n channel transistor.

4. A constant biasing circuit as set forth in claim 3 wherein said opposite polarity voltages includes a given positive voltage and a given negative voltage, said given positive voltage being connected to the gate of said n channel transistor and said given negative voltage being connected to the gate of said p channel transistor.

5. A constant biasing circuit comprising
first and second p channel transistors,
first and second n channel transistors, and
first and second points of reference potential, said first p channel transistor and said first n channel transistor being serially connected between said first and second points of reference potential, said second p channel transistor and said second n channel transistor being serially connected between the gates of said first p channel and n channel transistors, said first point of reference potential being connected to the gate of said second n channel transistor, and said second point of reference potential being connected to the gate of said second p channel transistor.

6. A constant biasing circuit as set forth in claim 5 wherein said first and second points of reference potential are positive and negative potentials, respectively.

7. A constant biasing circuit as set forth in claim 6 wherein said positive potential has a magnitude of +5 volts and said negative potential has a magnitude of −5 volts.

8. An operational amplifier having a push-pull output stage including a p channel field effect transistor and an n channel field effect transistor the gates of which are to be driven through a driving stage providing floating voltages to the respective gates of said p and n channel transistors, said operational amplifier comprising a constant biasing circuit including a symmetrical circuit having two series connected complementary transistors disposed between the gates of said p channel and n channel transistors and having gates connected to opposite polarity voltages.

9. An operational amplifier as set forth in claim 8 wherein said complementary transistors are complementary field effect transistors.

10. An operational amplifier as set forth in claim 9 wherein said complementary field effect transistors include a second p channel transistor and a second n channel transistor.

11. An operational amplifier as set forth in claim 10 wherein said opposite polarity voltages includes a given positive voltage and a given negative voltage, said given positive voltage being connected to the gate of said second n channel transistor and said given negative voltage being connected to the gate of said second p channel transistor.

12. An operational amplifier as set forth in claim 11 wherein said given positive voltage has a magnitude of +5 volts and said given negative voltage has a magnitude of −5 volts.

* * * * *